(12) United States Patent
Motosugi et al.

(10) Patent No.: US 9,190,245 B2
(45) Date of Patent: Nov. 17, 2015

(54) CHARGED PARTICLE BEAM WRITING APPARATUS, AND CHARGED PARTICLE BEAM WRITING METHOD

(71) Applicant: NuFlare Technology, Inc., Yokohama (JP)

(72) Inventors: Tomoo Motosugi, Kanagawa (JP); Takayuki Ohnishi, Kanagawa (JP); Kaoru Tsuruta, Kanagawa (JP); Kenji Ohtoshi, Kanagawa (JP)

(73) Assignee: NuFlare Technology, Inc., Yokohama (JP)

( * ) Notice: Subject to any disclaimer, the term of this patent is extended or adjusted under 35 U.S.C. 154(b) by 0 days.

(21) Appl. No.: 14/607,559

(22) Filed: Jan. 28, 2015

(65) Prior Publication Data
US 2015/0228455 A1 Aug. 13, 2015

(30) Foreign Application Priority Data

Feb. 10, 2014 (JP) .................................. 2014-023449

(51) Int. Cl.
| H01J 37/16 | (2006.01) |
| G21K 5/04 | (2006.01) |
| H01J 37/317 | (2006.01) |
| H01J 37/302 | (2006.01) |

(Continued)

(52) U.S. Cl.
CPC ............. *H01J 37/3174* (2013.01); *H01J 37/10* (2013.01); *H01J 37/20* (2013.01); *H01J 37/21* (2013.01); *H01J 37/3026* (2013.01); *H01J 2237/0492* (2013.01); *H01J 2237/063* (2013.01); *H01J 2237/103* (2013.01); *H01J 2237/2007* (2013.01); *H01J 2237/3173* (2013.01)

(58) Field of Classification Search
CPC ............. H01J 37/3056; H01J 37/3174; H01J 37/3045; H01J 37/16; H01J 37/3002; G21K 5/04
USPC ......... 250/492.22, 491.1, 492.2, 492.23, 288; 216/59, 66; 430/296
See application file for complete search history.

(56) References Cited

U.S. PATENT DOCUMENTS

| 5,113,072 A * | 5/1992 | Yamaguchi et al. ............. 850/16 |
| 6,573,516 B2 * | 6/2003 | Kawakami ............... 250/492.21 |

(Continued)

FOREIGN PATENT DOCUMENTS

JP 2007 43083 2/2007

OTHER PUBLICATIONS

Sukjong Bae, et al., "Deflector Contamination in E-beam Mask Writer and Its Effect on Pattern Placement Error of Photomask for Sub 20nm Device Node", Proc. of SPIE, vol. 8441, (2012), pp. 84410C-1-84410C-8.

*Primary Examiner* — David A Vanore
(74) *Attorney, Agent, or Firm* — Oblon, McClelland, Maier & Neustadt, L.L.P.

(57) ABSTRACT

A charged particle beam writing apparatus includes an emission unit to emit a charged particle beam, a stage to mount thereon a target object to be written, an objective lens to focus the charged particle beam on a surface of the target object, a chamber to house the stage, a measurement unit to measure a partial pressure of a predetermined gas in the chamber in a state where a pressure inside the chamber is controlled to be lower than an atmospheric pressure, and an adjustment unit to adjust a focus position for focusing the charged particle beam on the target object, based on the partial pressure of the predetermined gas.

11 Claims, 8 Drawing Sheets

(51) Int. Cl.
*H01J 37/21* (2006.01)
*H01J 37/20* (2006.01)
*H01J 37/10* (2006.01)

(56) References Cited

U.S. PATENT DOCUMENTS

| | | | |
|---|---|---|---|
| 6,888,149 B2 * | 5/2005 | Ikku | 250/491.1 |
| 7,589,335 B2 * | 9/2009 | Matsukawa et al. | 250/492.22 |
| 8,133,402 B2 * | 3/2012 | Ohnishi et al. | 216/41 |
| 8,362,450 B2 * | 1/2013 | Iizuka et al. | 250/492.22 |
| 8,618,478 B2 * | 12/2013 | Smit et al. | 250/310 |
| 8,835,881 B2 * | 9/2014 | Kamikubo | 250/492.22 |
| 8,963,100 B2 * | 2/2015 | Yasaka et al. | 250/423 F |
| 2007/0023689 A1 | 2/2007 | Iizuka et al. | |
| 2011/0220788 A1 * | 9/2011 | Laue et al. | 250/288 |
| 2013/0099133 A1 * | 4/2013 | Yasaka et al. | 250/423 R |

* cited by examiner

CHARGED PARTICLE BEAM WRITING APPARATUS, AND CHARGED PARTICLE BEAM WRITING METHOD

CROSS-REFERENCE TO RELATED APPLICATION

This application is based upon and claims the benefit of priority from the prior Japanese Patent Application No. 2014-023449 filed on Feb. 10, 2014 in Japan, the entire contents of which are incorporated herein by reference.

BACKGROUND OF THE INVENTION

1. Field of the Invention

Embodiments of the present invention relate generally to a charged particle beam writing apparatus and a charged particle beam writing method, and more specifically, relate to a method for focus adjustment for an electron beam in the electron beam writing apparatus, for example.

2. Description of Related Art

The lithography technique that advances miniaturization of semiconductor devices is extremely important as a unique process whereby patterns are formed in semiconductor manufacturing. In recent years, with high integration of LSI, the line width (critical dimension) required for semiconductor device circuits is decreasing year by year. For forming a desired circuit pattern on such semiconductor devices, a master or "original" pattern (also called a mask or a reticle) of high accuracy is needed. Thus, the electron beam (EB) writing technique, which intrinsically has excellent resolution, is used for producing such a high-precision master pattern.

Figure 11:
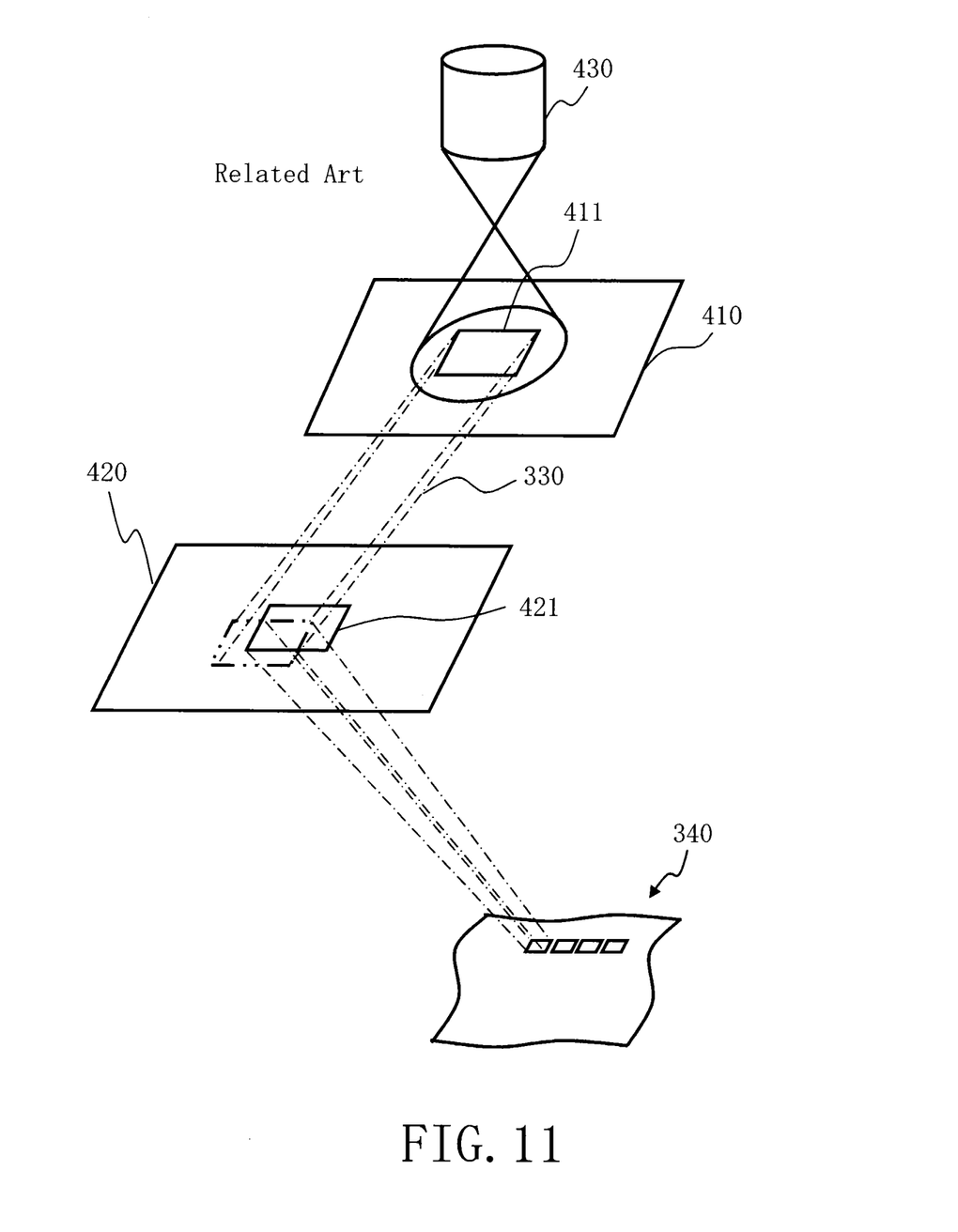
FIG. 11 is a conceptual diagram explaining operations of a variable shaping type electron beam writing apparatus.

FIG. 11 is a conceptual diagram explaining operations of a variable shaping type electron beam writing or "drawing" apparatus. The variable shaping type electron beam (EB) writing apparatus operates as described below. A first aperture plate 410 has a quadrangular aperture 411 for shaping an electron beam 330. A second aperture plate 420 has a variable shape aperture 421 for shaping the electron beam 330 having passed through the aperture 411 of the first aperture plate 410 into a desired quadrangular shape. The electron beam 330 emitted from a charged particle source 430 and having passed through the aperture 411 is deflected by a deflector to pass through a part of the variable shape aperture 421 of the second aperture plate 420, and thereby to irradiate a target object or "sample" 340 placed on a stage which continuously moves in one predetermined direction (e.g., the x direction) during writing. In other words, a quadrangular shape that can pass through both the aperture 411 of the first aperture plate 410 and the variable shape aperture 421 of the second aperture plate 420 is used for pattern writing in a writing region of the target object 340 on the stage continuously moving in the x direction. This method of forming a given shape by letting beams pass through both the aperture 411 of the first aperture plate 410 and the variable shape aperture 421 of the second aperture plate 420 is referred to as a variable shaped beam (VSB) system.

In the writing apparatus, a pattern is written by deflecting a charged particle beam, such as an electron beam, by a deflector so as to irradiate a desired position, but there is a problem with use of the writing apparatus that beam drift occurs as the deflector becomes contaminated due to contaminants, etc. Therefore, correction of the beam drift is performed in the electron beam writing (refer to, e.g., Japanese Patent Application Laid-open (JP-A) No. 2007-43083). However, even if the drift amount is corrected, contaminants that cause the problem are not eliminated. Thus, in order to inhibit the beam drift, it is thought effective to remove the contaminants. Then, flowing cleaning gas in the optical column in the writing apparatus is considered to remove the contaminants.

However, a problem has been found that if the cleaning gas is flowed, the focus of an electron beam deviates.

BRIEF SUMMARY OF THE INVENTION

According to one aspect of the present invention, a charged particle beam writing apparatus includes an emission unit configured to emit a charged particle beam, a stage configured to mount thereon a target object to be written, an objective lens configured to focus the charged particle beam on a surface of the target object, a chamber configured to house the stage, a measurement unit configured to measure a partial pressure of a predetermined gas in the chamber in a state where a pressure inside the chamber is controlled to be lower than an atmospheric pressure, and an adjustment unit configured to adjust a focus position for focusing the charged particle beam on the target object, based on the partial pressure of the predetermined gas.

According to another aspect of the present invention, a charged particle beam writing apparatus includes an emission unit configured to emit a charged particle beam, a stage configured to mount thereon a target object to be written, an objective lens configured to focus the charged particle beam on a surface of the target object, a deflector configured to deflect the charged particle beam to a desired position on the target object, a chamber configured to house the stage, a measurement unit configured to measure a partial pressure of a predetermined gas in the chamber in a state where a pressure inside the chamber is controlled to be lower than an atmospheric pressure, and a deflection control unit configured to control a deflection amount of the deflector, and adjust a focus position for focusing the charged particle beam on the target object, based on the partial pressure of the predetermined gas by using the deflector.

Moreover, according to one aspect of the present invention, a charged particle beam writing method includes measuring a partial pressure of a predetermined gas in a chamber housing a stage on which a target object to be written is placed, in a state in which a pressure inside the chamber is controlled to be lower than an atmospheric pressure, adjusting a focus position for focusing a charged particle beam on the target object, based on the partial pressure of the predetermined gas, and writing a pattern on the target object by using the charged particle beam, in a state in which the focus position has been adjusted based on the partial pressure of the predetermined gas.

DETAILED DESCRIPTION OF THE INVENTION

In the embodiments described below, a writing apparatus and method capable of correcting a focus deviation of a beam will be described.

In the embodiments described below, there will be described a configuration in which an electron beam is used as an example of a charged particle beam. The charged particle beam is not limited to the electron beam, and other charged particle beam such as an ion beam may also be used. Moreover, a variable shaping type electron beam writing apparatus will be described as an example of a charged particle beam apparatus.

FIRST EMBODIMENT

Figure 1:
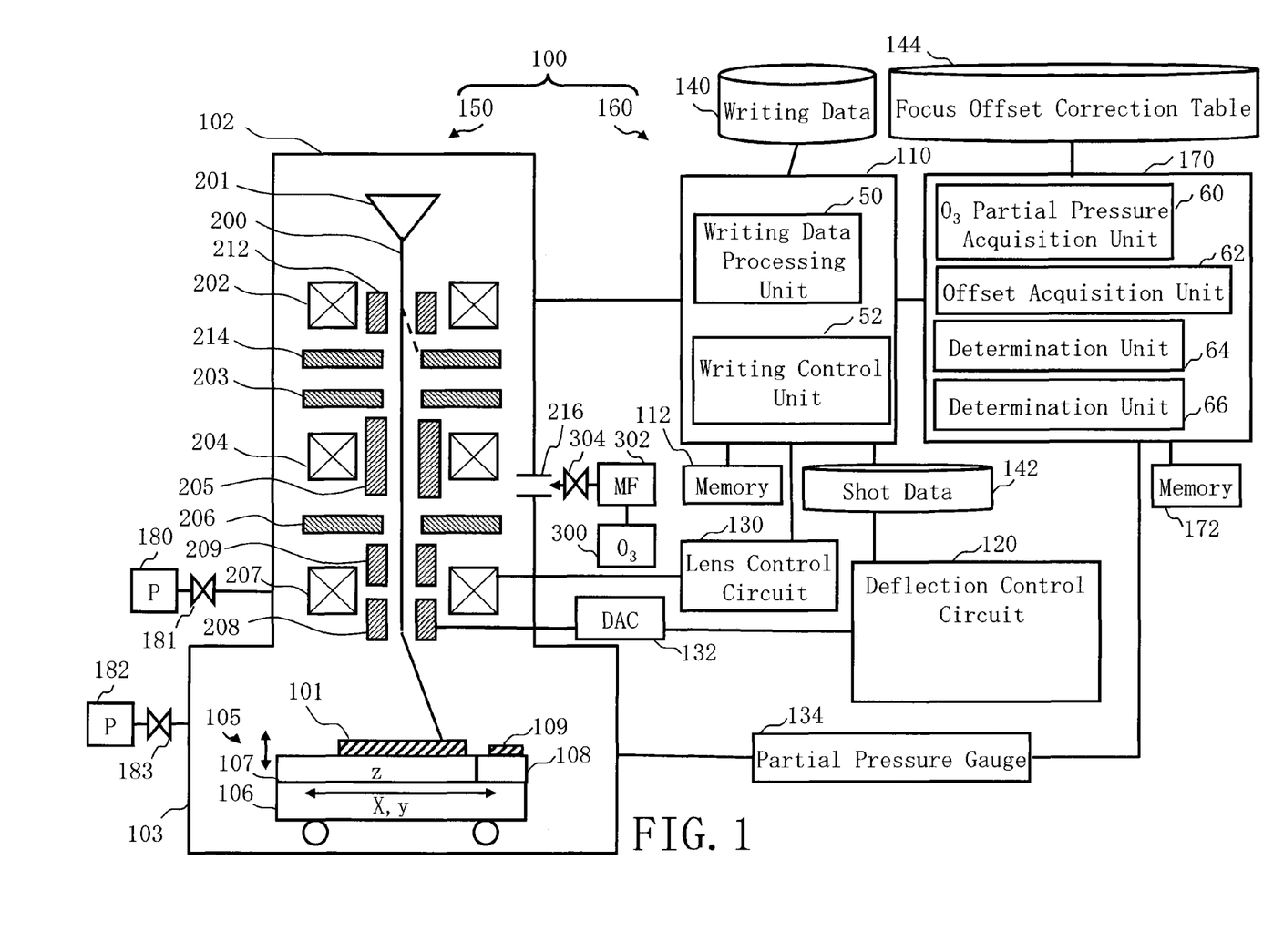
FIG. 1 is a schematic diagram showing the configuration of a writing apparatus according to a first embodiment.

FIG. 1 is a schematic diagram showing the configuration of a writing apparatus according to the first embodiment. In FIG. 1, a writing (or "drawing") apparatus 100 includes a writing unit 150 and a control unit 160. The writing apparatus 100 is an example of a charged particle beam writing apparatus, and, particularly, is an example of a variable shaping type electron beam writing apparatus. The writing unit 150 includes an electron optical column 102 and a writing chamber 103. In the electron optical column 102, there are arranged an electron gun assembly 201, an illumination lens 202, a blanking deflector 212, a blanking aperture plate 214, a first aperture plate 203, a projection lens 204, a deflector 205, a second aperture plate 206, an objective lens 207, a main deflector 208, and a sub deflector 209. In the writing chamber 103, a stage 105 is arranged. The stage 105 includes an XY stage 106 that can move in the horizontal direction (x and y directions), and a Z stage 107 that is arranged on the XY stage 106 and can move in the up-and-down direction (z direction). The Z stage 107 is not arranged all over the surface of the XY stage 106 but arranged leaving a portion of the surface uncovered. A target object or "sample" 101 to be written, such as a mask, on which a layer of resist has been coated is placed on the Z stage 107. The target object 101 is, for example, an exposure mask used for manufacturing semiconductor devices. Moreover, the target object 101 may be, for example, a mask blank on which a layer of resist has been coated and no pattern has yet been written. A support member 108 being in the shape of a bar, for example, is arranged on a part of the surface region of the XY stage 106, where the Z stage 107 is not placed. Moreover, a mark 109 is arranged on the support member 108. The height position of the upper surface of the mark 109 is arranged (fixed) such that the upper surface of the target object 101 can be the same height position as that of the the mark 109 by the movement of the Z stage 107.

On the side of the electron optical column 102, a supply hole 216 that can supply cleaning gas is formed, and a supply line is connected to it. The supply line is connected to a gas tank 300, and a mass flow meter (MF) 302 and a valve 304 are arranged in the middle of the supply line. It is preferable that the height position of the supply hole 216 is located at the upper stream side (beam irradiation source side) than the main deflector 208 and the sub deflector 209 serving as objective deflectors. The gas tank 300 is filled up with ozone ($O_3$), and the $O_3$ gas can be supplied to the inside of the electron optical column 102 from the gas tank 300.

Moreover, on the side of the electron optical column 102, an exhaust opening is formed and connected to a vacuum pump 180 through a valve 181. The inside of the electron optical column 102 is controlled to be in a vacuum state since the internal gas is exhausted by the vacuum pump 180, thereby being a lower pressure than the atmospheric pressure. Similarly, an exhaust opening is formed on the side of the writing chamber 103, and connected to a vacuum pump 182 through a valve 183. The inside of the writing chamber 103 is controlled to be in a vacuum state since the internal gas is exhausted by the vacuum pump 182, thereby being a lower pressure than the atmospheric pressure.

The control unit 160 includes a control computer 170, a memory 172, a control computer 110, a memory 112, a deflection control circuit 120, a lens control circuit 130, a DAC (digital/analog converter) amplifier 132, a partial pressure gauge 134, and storage devices 140, 142, and 144 such as magnetic disk drives. The control computer 170, the memory 172, the control computer 110, the memory 112, the deflection control circuit 120, the lens control circuit 130, the partial pressure gauge 134, and the storage devices 140, 142, and 144 are mutually connected through a bus (not shown).

In the control computer 110, there are arranged a writing data processing unit 50 and a writing control unit 52. Functions such as the writing data processing unit 50 and the writing control unit 52 may be configured by hardware such as an electric circuit or by software such as a program causing a computer to implement these functions. Alternatively, the functions may be configured by a combination of hardware and software. Data which is input and output to/from the writing data processing unit 50 and the writing control unit 52, and data being operated are stored in the memory 112 each time.

In the control computer 170, there are arranged an ozone ($O_3$) partial pressure acquisition unit 60, an offset acquisition unit 62, and determination units 64 and 66. Functions such as the $O_3$ partial pressure acquisition unit 60, the offset acquisition unit 62, and the determination units 64 and 66 may be configured by hardware such as an electric circuit or by software such as a program causing a computer to implement these functions. Alternatively, the functions may be configured by a combination of hardware and software. Data which is input and output to/from the $O_3$ partial pressure acquisition unit 60, the offset acquisition unit 62, and the determination units 64 and 66, and data being operated are stored in the memory 172 each time.

FIG. 1 shows a configuration necessary for explaining the first embodiment. Other configuration elements generally necessary for the writing apparatus 100 may also be included. For example, although a multiple stage deflector of two stages of the main deflector 208 and the sub deflector 209 is herein used for position deflection (objective deflection), a single stage deflector or a multiple stage deflector of three or more stages may also be used for position deflection. Moreover, input devices, such as a mouse and a keyboard, a monitoring device, an external interface circuit, etc. may be connected to the writing apparatus 100.

Here, $O_3$ gas is effective for inhibiting beam drift due to contamination of the deflector (for example, the main deflector 208 and the sub deflector 209). An oxygen radical can be generated by supplying $O_3$ gas into the electron optical column 102 and irradiating an electron beam to the $O_3$ gas. Then, the oxygen radical dissolves and gasifies the contaminants (hydrocarbon) adhering to the deflector, thereby removing the contaminants. Consequently, the beam drift can be inhibited or reduced. Meanwhile, the $O_3$ gas supplied in the electron optical column 102 spreads not only in the electron optical column 102 but also in the writing chamber 103. It has been checked by experiments that the focal depth (focus) of an electron beam 200 in $O_3$ gas atmosphere changes compared with that in the vacuum state where no $O_3$ gas has been supplied. In focusing the electron beam, adjustment is achieved automatically using the mark 109 on the stage 105 at a predetermined timing, and then, a minute height difference occurs between the upper surface of the mark 109 for adjustment and the writing surface of the target object 101.

Figure 2:
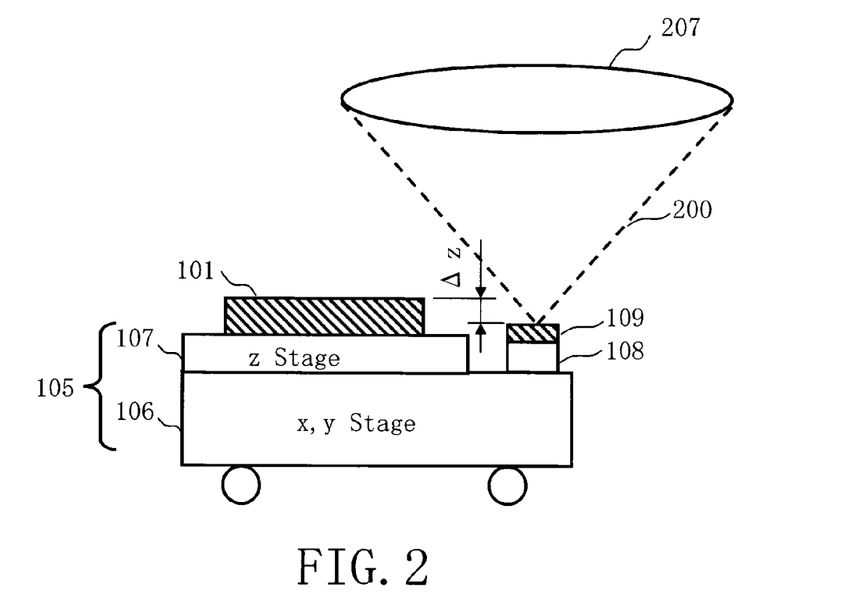
FIG. 2 is a conceptual diagram illustrating a method of focus adjustment according to the first embodiment.

FIG. 2 is a conceptual diagram illustrating a method of focus adjustment according to the first embodiment. The focus of the electron beam 200 is adjusted on the fixed mark 109 in advance. The adjustment is performed by changing excitation of the objective lens 207. At this time, the excitation value of the objective lens 207 shall be A. When writing, the Z stage 107 is moved in the z direction by ΔZ so that the height position of the upper surface (writing surface) of the target object 101 may be equal to that of the surface of the fixed mark 109. For example, the height positions of the surface of the target object 101 and the surface of the mark 109 are measured by a Z sensor (not shown), and then, the Z stage 107 should be moved such that the height position of the surface of the target object 101 is equal to that of the surface of the mark 109.

In theory, in the state described above, since the height position of the surface of the target object 101 and that of the fixed mark 109 are equal to each other, a just focus condition should be achieved also on the the surface of the target object 101 if the excitation value of the objective lens 207 is A. However, in practice, when a pattern is written while changing the excitation of the objective lens 207 and the written pattern is measured, just focus condition cannot be achieved at the time of the excitation value being A, but can be achieved at the time of a varied excitation value being A', which has been proved by experiments.

According to what is described above, when writing the target object 101, a fixed value (A'-A) is added to the optimal adjustment value A of the objective lens acquired by using the fixed mark 109. This (A'-A) is called focus offset. As long as the material and thickness of the target object 101 remain the same, the same focus offset value can be obtained, which is known from the result of an experiment.

Figure 3:
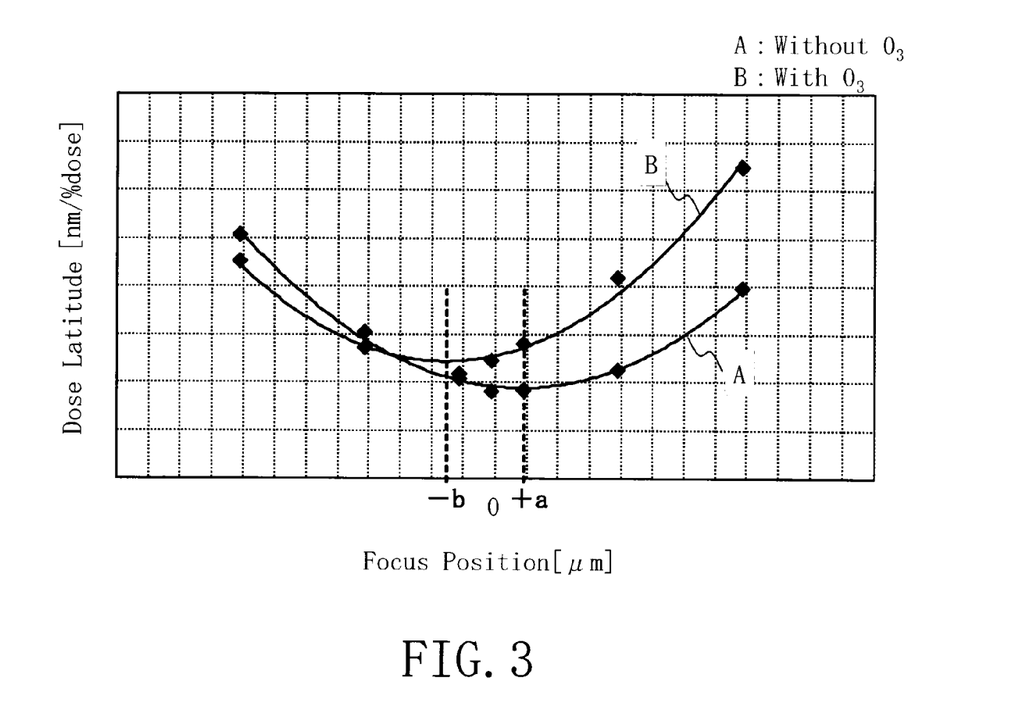
FIG. 3 shows an example of a graph illustrating a deviation of a focus position according to the first embodiment.

FIG. 3 shows an example of a graph illustrating a deviation of a focus position according to the first embodiment. In FIG. 3, the ordinate axis shows a dose latitude, and the abscissa axis shows a focus position. In FIG. 3, the focus position "0" indicates a reference position which has been focus-adjusted by using the mark 109. The focus position is adjusted to be corresponding to a flection point where the dose latitude is the smallest. The dose latitude should be defined as a parameter (coefficient) indicating a relation between a pattern dimension CD (a changed amount) and an electron beam dose. In the environment where $O_3$ gas is not supplied into the chamber, that is, where contaminant is not cleaned, the focus position is deviated from the reference position by +a, for example, as shown in the graph A. Therefore, a focus offset equivalent to +a needs to be performed. By contrast, in the environment where $O_3$ gas for cleaning contaminants has been supplied into the chamber, the focus position is deviated from the reference position by −b, for example, as shown in the graph B. Therefore, a focus offset equivalent to −b needs to be performed. Thus, the focus positions are different depending upon whether the $O_3$ gas exists or not. Furthermore, the focus position changes not only depending upon the existence or nonexistence of $O_3$ gas but also depending upon a partial pressure of the $O_3$.

Figure 4:
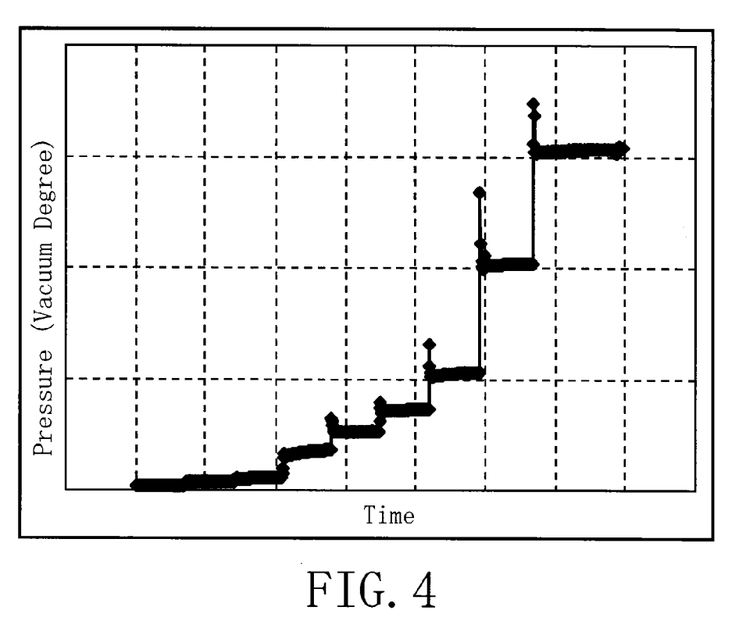
FIG. 4 shows an example of the relation between a pressure in an electron optical column and time according to the first embodiment.

FIG. 4 shows an example of the relation between the pressure in the electron optical column and the time according to the first embodiment. FIG. 4 shows an example of the case in which once the pressure inside the electron optical column 102 is made low (vacuum) by vacuumizing by a vacuum pump, and then the pressure inside it is gradually made higher (the vacuum degree becoming lower) by supplying $O_3$ gas thereto at every passage of a predetermined time.

Figure 5:
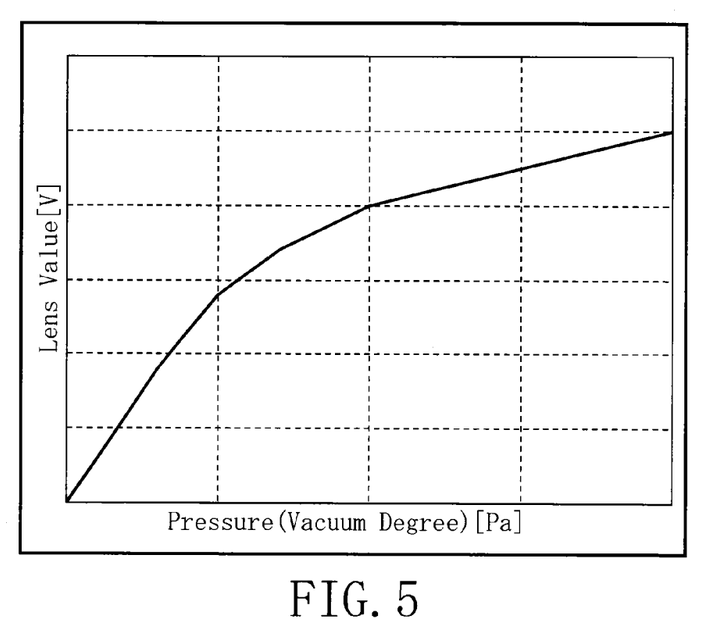
FIG. 5 shows an example of the relation between a pressure in an electron optical column and a lens value (excitation) of an objective lens at a focus position according to the first embodiment.

FIG. 5 shows an example of the relation between the pressure in the electron optical column and the lens value (excitation) of the objective lens at the focus position according to the first embodiment. FIG. 5 shows, as in FIG. 4, an example of change of the lens value (excitation) of the objective lens 207 at the focus position when the pressure inside the electron optical column 102 is gradually made higher (the vacuum degree becoming lower) by supplying $O_3$ gas thereto. Thus, it turns out that the lens value (excitation) of the objective lens 207 for performing focusing changes when the pressure inside the electron optical column 102 is gradually made higher (the vacuum degree becoming lower) by supplying the $O_3$ gas thereto.

Figure 6:
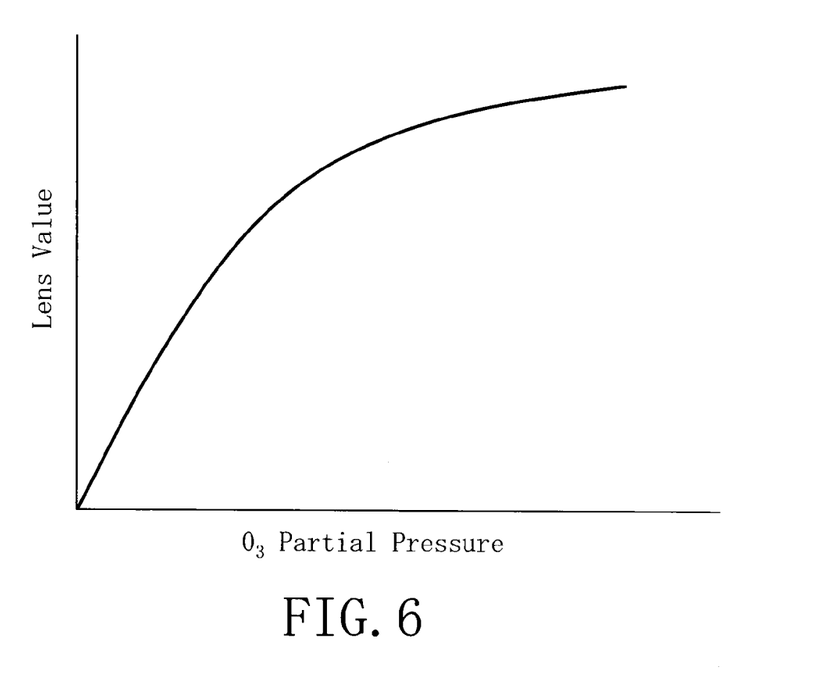
FIG. 6 shows an example of the relation between an $O_3$ gas partial pressure in an electron optical column and a lens value (excitation) of an objective lens at a focus position according to the first embodiment.

FIG. 6 shows an example of the relation between the $O_3$ gas partial pressure in an electron optical column and the lens value (excitation) of an objective lens at the focus position according to the first embodiment. Based on the relations of FIGS. 4 and 5, when the supply amount of $O_3$ gas is gradually increased ($O_3$ gas partial pressure is gradually increased), the lens value (excitation) of the objective lens 207 changes as shown in FIG. 6. Then, according to the first embodiment, the relation between the $O_3$ gas partial pressure and the focus offset value is obtained in advance by experiment, etc. The focus offset value may be defined as an excitation value (A'-A) as described above, or, for example, maybe defined as a deviation amount (height dimension) with respect to the height direction (z direction).

Figure 7:
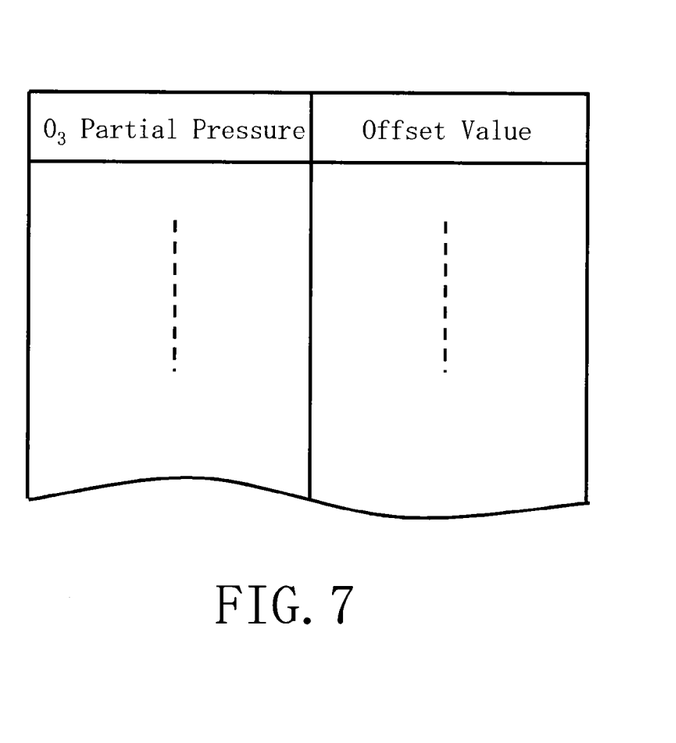
FIG. 7 is a conceptual diagram showing an example of a correlation table according to the first embodiment.

FIG. 7 is a conceptual diagram showing an example of a correlation table according to the first embodiment. A correlation table (correction table) showing the correlation between the $O_3$ gas partial pressure and the focus offset value is generated based on experiments, etc. as shown in FIG. 7. The correlation table is stored in the storage device 144 before starting writing.

Figure 8:
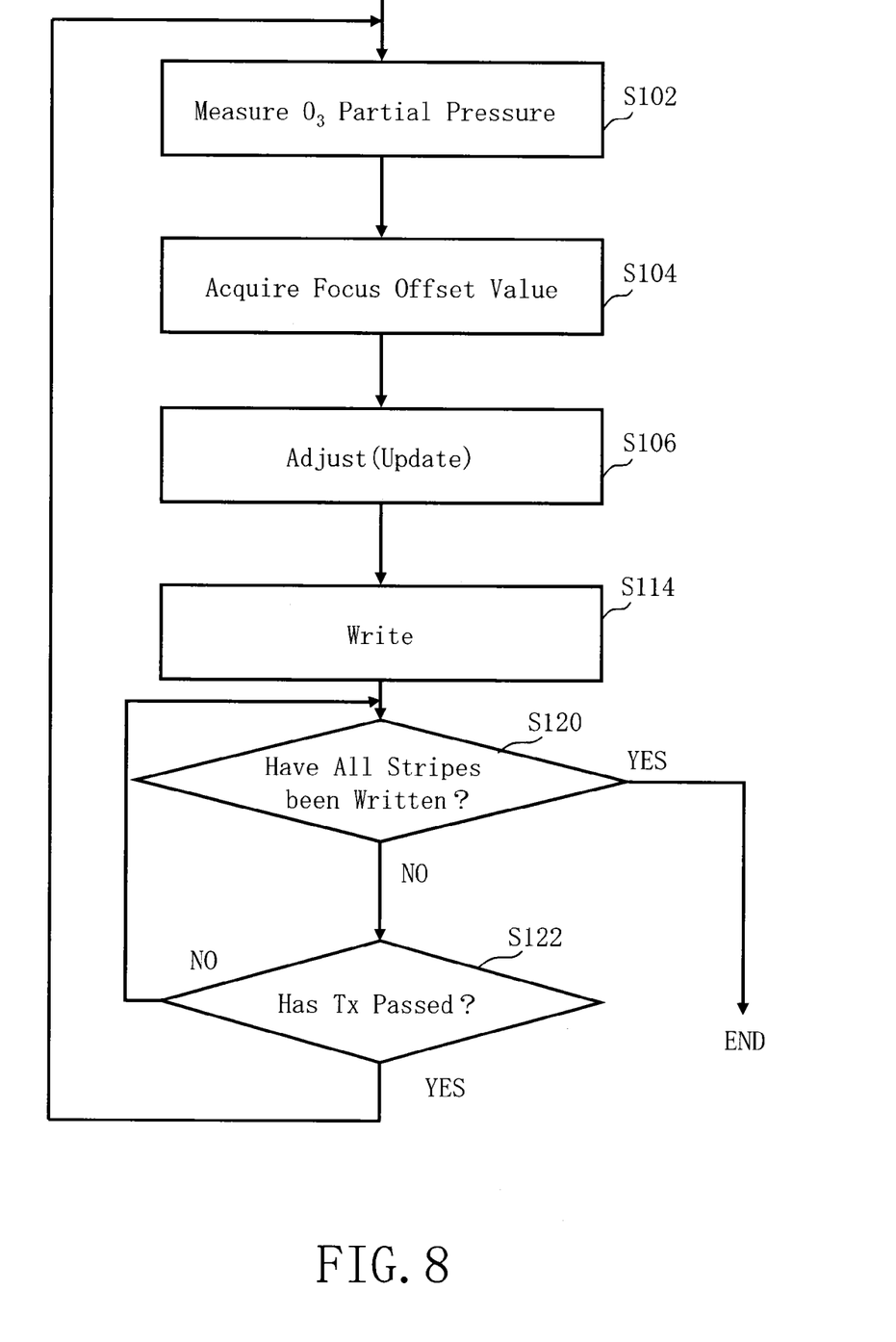
FIG. 8 is a flowchart showing main steps of a writing method according to the first embodiment.

FIG. 8 is a flowchart showing main steps of a writing method according to the first embodiment. In FIG. 8, the writing method according to the first embodiment executes a series of steps: an $O_3$ gas partial pressure measurement step (S102), a focus offset acquisition step (S104), an adjustment (updating) step (S106), a writing step (S114), a determination step (S120), and a determination step (S122).

First, it is assumed that the writing apparatus 100 has already performed writing processing for other target objects before $O_3$ gas for removing contaminants of the deflector is flowed. In that case, obviously, adjusting the focus by using the mark 109 and measuring an offset value from the focus position have already been performed as described above. When contaminants become attached to the deflector (for example, the main deflector 208 and the sub deflector 209) due to use of the writing apparatus 100, $O_3$ gas is supplied to the inside of the electron optical column 102, and contaminants are removed by the oxygen radical generated by irradiation of the electron beam 200 as described above. FIG. 8 shows operations to be performed after cleaning for contamination removal or at least after supplying $O_3$ gas into the electron optical column 102.

In the $O_3$ gas partial pressure measurement step (S102), the partial pressure gauge 134 measures a partial pressure of $O_3$ gas (predetermined gas) in the writing chamber 103 in the state controlled to have a lower pressure than the atmospheric pressure by the vacuum pump 182 and the like. The partial pressure gauge 134 serves as an example of a measurement unit. The measurement result is output to the $O_3$ partial pressure acquisition unit 60. Thereby, the $O_3$ partial pressure acquisition unit 60 acquires an $O_3$ gas partial pressure in the writing chamber 103. The $O_3$ gas may remain flowing in the electron optical column 102, or may flow only at the time of cleaning, for example. By continuing to flow the $O_3$ gas, cleaning can be automatically performed also during writing processing by using electron beams for writing processing.

In the focus offset acquisition step (S104), the offset acquisition unit 62 reads a correlation table from the storage device 144, and acquires a focus offset value corresponding to a measured partial pressure of the $O_3$ gas. The acquired focus offset value is output to the control computer 110.

In the adjustment (updating) step (S106), the writing control unit 52 sets the input focus offset value in the lens control circuit 130. Although the focus offset value which has been used until now has already been set in advance in the lens control circuit 130, the value having been set is updated to a new focus offset value. Thereby, the voltage applied to excite the objective lens 207 is corrected. Therefore, depending upon the partial pressure of the $O_3$ gas (predetermined gas), the focus position by the objective lens 207 is adjusted. The lens control circuit 130 is an example of an adjustment unit. When the focus offset value is defined by the excitation value (A'-A), the lens control circuit 130 should add an updated focus offset value to the original excitation value. When the focus offset value is defined, for example, as a deviation amount (height dimension) with respect to the height direction (z direction), the lens control circuit 130 should add an updated focus offset value to the height direction (z direction) position corresponding to the original excitation value, and then convert the added value to a corresponding excitation value.

In the writing step (S114), the writing unit 150 writes a pattern on the target object by using a charged particle beam, in the state in which the focus position has been adjusted depending upon the partial pressure of the predetermined gas. Here, a pattern is written on the target object 101, for example, while the $O_3$ gas (predetermined gas) is being flowed in the electron optical column 102 (and the writing chamber 103) (chamber). When writing, the writing apparatus 100 operates as described below. First, the writing data processing unit 50 reads pattern data (writing data) of a chip to be written from the storage device 140, and performs data conversion processing of a plurality of steps so as to generate apparatus-specific shot data. In the pattern data of a chip, at least one or more figure pattern is defined. However, in order to write figure patterns by the writing apparatus 100, it is necessary to divide each figure pattern defined in the pattern data of a chip, to be the size that can be irradiated by one beam shot. Then, for actually performing writing, the writing data processing unit 50 generates a shot figure by dividing each figure pattern into the size that can be irradiated by one beam shot. Shot data is generated for each shot figure. In the shot data, figure data, such as a figure type, a figure size, and an irradiation position, is defined. In addition, an irradiation time in accordance with a dose is also defined. Generated shot data is sorted in the storage device 142.

In the writing apparatus 100, a writing region 10 of the target object 101 is virtually divided into a plurality of strip-shaped stripe regions aligned along the y direction, for example, by the width deflectable by the main deflector 208. Then, each stripe region is virtually divided into a plurality of mesh-like subfields (SF) (small regions) by the size deflectable by the sub deflector 209. A shot figure corresponding to each shot position in each SF is written.

The writing apparatus 100 performs writing processing for each stripe region by using a multi-stage deflector. In this case, a two-stage deflector composed of the main deflector 208 and the sub deflector 209 is used as an example. While the XY stage 105 is continuously moving in the -x direction, for example, writing is performed in the x direction in the first stripe region. After the first stripe region has been written, writing is performed in the same direction or in the opposite direction in the second stripe region 20. Then, similarly, writing is performed in the third and subsequent stripe regions. The main deflector 208 deflects the electron beam 200, in order, to a reference position of SF such that the movement of the XY stage 105 is followed. The sub deflector 209 deflects the electron beam 200 from the reference position A of each SF to each shot position of an irradiating beam in the SF 30 concerned. Thus, the main deflector 208 and the sub deflector 209 have different size deflection regions.

The deflection control circuit 120 generates main deflection data and sub deflection data according to the position defined in shot data. Similarly, the deflection control circuit 120 generates blanking data based on the shot data or irradiation time data (dose data) separately prepared. Similarly, the deflection control circuit 120 generates shaping data according to the figure type and size defined in the shot data. The main deflection data is output to the DAC amplifier 132. The sub deflection data is output to a DAC amplifier for sub deflection (not shown). The blanking data is output to a DAC amplifier for blanking control (not shown). The shaping data is output to a DAC amplifier for beam shaping (not shown).

Then, the DAC amplifier for blanking control (not shown) converts a digital signal to an analog signal and amplifies it to be applied as a deflection voltage to the blanking deflector 212. The electron beam 200 is deflected by the deflection voltage, and switching on and off of a beam is performed. Thereby, each beam shot is formed.

The DAC amplifier for shaping deflection control (not shown) converts a digital signal to an analog signal and amplifies it to be applied as a deflection voltage to the deflector 205. The electron beam 200 is deflected by the deflection voltage, and the passing position of the opening in the second aperture plate 206 of the electron beam 200 having passed through the first aperture plate 203 is controlled. Thereby, the beam of each shot is variably shaped.

The DAC amplifier 132 converts a digital signal to an analog signal and amplifies it to be applied as a deflection voltage to the main deflector 208. The electron beam 200 is deflected by the deflection voltage, and the beam of each shot is deflected to a reference position of a predetermined subfield (SF) obtained by virtual division into meshes.

The DAC amplifier for sub deflection (not shown) converts a digital signal to an analog signal and amplifies it to be applied as a deflection voltage to the sub deflector 209. The electron beam 200 is deflected by the deflection voltage, and the beam of each shot is deflected to each shot position in a predetermined subfield (SF) obtained by virtual division into meshes.

As described above, based on a signal from each DAC amplifier controlled by the deflection control circuit 120, the writing unit 150 writes a figure pattern concerned on the target object 100 by using the electron beam 200. Specifically, it operates as described below.

When the electron beam 200 emitted from the electron gun assembly 201 (an emission unit) passes through the blanking deflector 212 controlled by a deflection signal from the DAC amplifier for blanking, it is controlled by the blanking deflector 212 to pass through the blanking aperture plate 214 when in the "beam on" state, and to be deflected such that the entire beam is blocked by the blanking aperture plate 214 when in the "beam off" state. The electron beam 200 that has passed through the blanking aperture 214 during the period from the time of changing from the "beam off" state to the "beam on" state to the time of again changing to the "beam off" state serves as one shot of the electron beam. The blanking deflector 212 controls the direction of the passing electron beam 200 to alternately generate the "beam on" state and the "beam off" state. For example, no voltage should be applied when in the "beam on" state, and a voltage should be applied to the blanking deflector 212 when in the "beam off" state. The dose per shot of the electron beam 200 to irradiate the target object 101 is adjusted depending upon an irradiation time t of each shot.

As described above, each shot of the electron beam 200, generated by passing through the blanking deflector 212 and the blanking aperture plate 214, irradiates the whole of the first shaping aperture plate 203 having a quadrangular opening by the illumination lens 202. Here, the electron beam 200 is first shaped to a quadrangle. Then, after having passed through the first shaping aperture 203, the electron beam 200 of the first aperture image is projected onto the second shaping aperture plate 206 by the projection lens 204. The first aperture image on the second shaping aperture plate 206 is deflection controlled by the deflector 205 so as to change (variably shape) the beam shape and the beam size. Such variable beam shaping is performed for each shot, and, generally, each shot is shaped to have a different shape and size. Then, after having passed through the second shaping aperture plate 206, the electron beam 200 of the second aperture image is focused by the objective lens 207 whose focus position has been corrected by performing focus offset calibration adjusted depending on a partial pressure of $O_3$ gas (predetermined gas), and deflected by the main deflector 208 and the sub deflector 209 to reach a desired position on the target object 101 placed on the XY stage 105 which is continuously moving. FIG. 1 shows the case of using multiple stage deflection of the main and sub deflection for position deflection. In such a case, the electron beam 200 of a shot concerned is deflected to a reference position of an SF 30 by the main deflector 208 while the movement of the stage is followed, and the beam of the shot concerned should be deflected to each irradiation position in the SF by the sub deflector 209. A desired pattern is written by repeating such operations and combining a shot figure of each shot. The writing operation is performed for each stripe region.

As described above, according to the first embodiment, a pattern is written on the target object 101 in the state in which a focus position has been adjusted using a focus offset value corresponding to a partial pressure of a predetermined gas in the chamber. By this operation, a focus deviation (defocus) can be inhibited or reduced.

In the determination step (S120), the determination unit 64 determines whether writing has been completed with respect to all the stripe regions or not whenever the writing processing for one stripe region is finished. If there is a stripe region which has not been written yet, it proceeds to the determination step (S122). If writing has been completed for all the stripe regions, the writing processing is finished.

In the determination step (S122), the determination unit 66 determines whether a predetermined period Tx for performing focus adjustment has passed or not. When not having passed, it returns to the determination step (S120). Then, the determination step (S120) and the determination step (S122) are repeated until writing has been completed for all the stripe regions or a predetermined period has passed. When the predetermined period has passed, it returns to the $O_3$ gas partial pressure measurement step (S102), and each step from the $O_3$ gas partial pressure measurement step (S102) to the determination step (S122) is repeated until the writing has been completed for all the stripe regions. The period Tx for focus adjustment may be for writing each stripe region or for writing a plurality of stripe regions. In addition, the period Tx may be set variably. For example, the period may be short at first and then may become gradually longer. For example, the period Tx for focus adjustment may be performed according to the timing of correcting beam drift (not shown). Alternatively, it may be performed according to the timing of removal of contaminants adhering to the deflector, etc. The intervals to remove contaminants adhering to the deflector, etc. may be at writing of each stripe region or at writing a plurality of stripe regions. Alternatively, the intervals may be at writing a plurality of target objects 101.

As described above, according to the first embodiment, contaminants adhering to a deflector etc. can be removed, and beam focus deviation due to inflow of gas can be corrected. Therefore, positional deviation, etc. of a pattern caused by defocus can be inhibited or reduced. Furthermore, beam drift can be inhibited or reduced by removal of contaminants.

SECOND EMBODIMENT

Although in the first embodiment the voltage value for exciting the objective lens 207 is corrected, it is not limited thereto. According to the second embodiment, focus deviation is corrected by another method.

Figure 9:
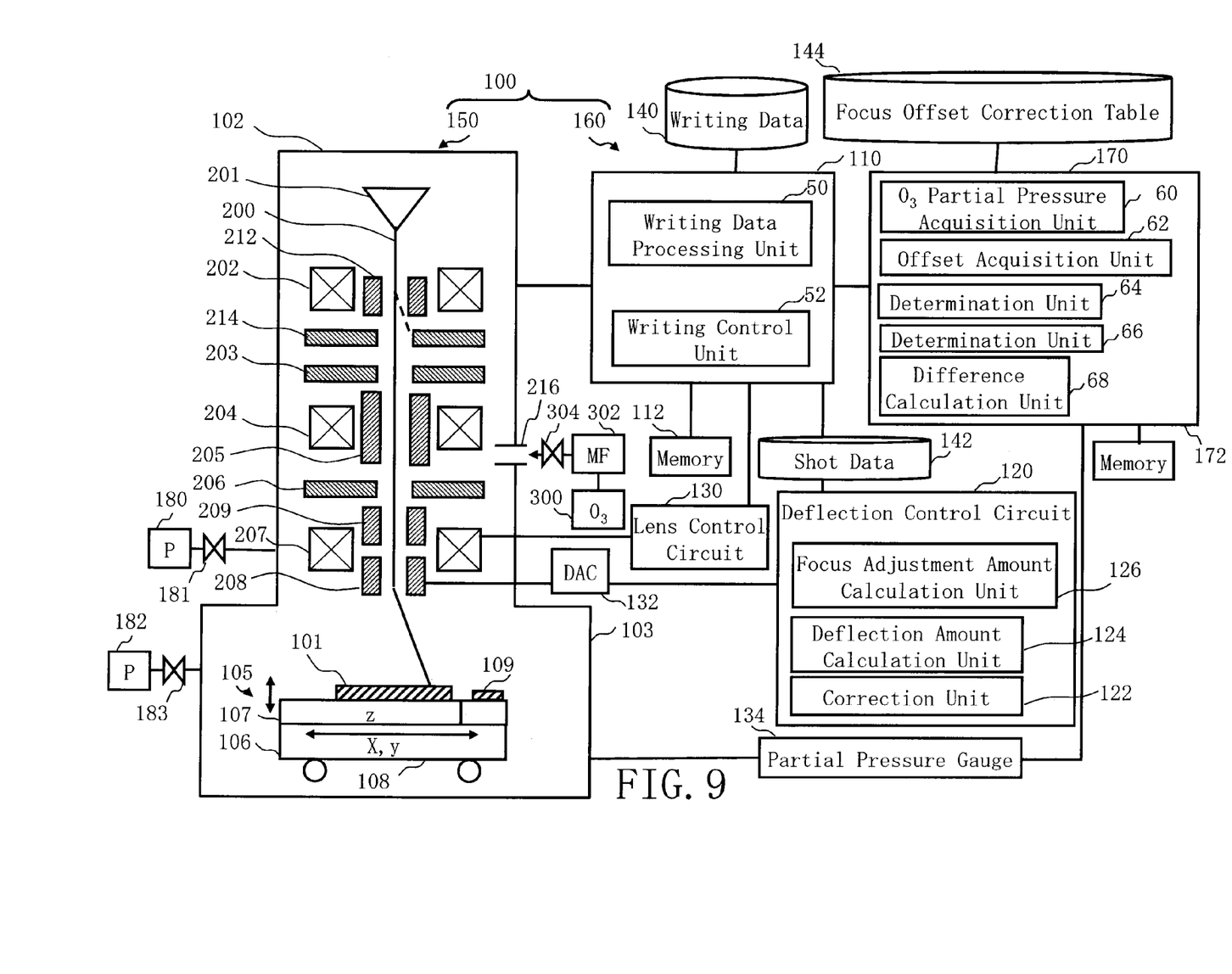
FIG. 9 is a schematic diagram showing the configuration of a writing apparatus according to the second embodiment.

FIG. 9 is a schematic diagram showing the configuration of a writing apparatus according to the second embodiment. FIG. 9 is the same as FIG. 1 except that a difference calculation unit 68 is added in the control computer 170, and that a correction unit 122, a deflection amount calculation unit 124, and a focus adjustment amount calculation unit 126 are added in the deflection control circuit 120.

Figure 10:
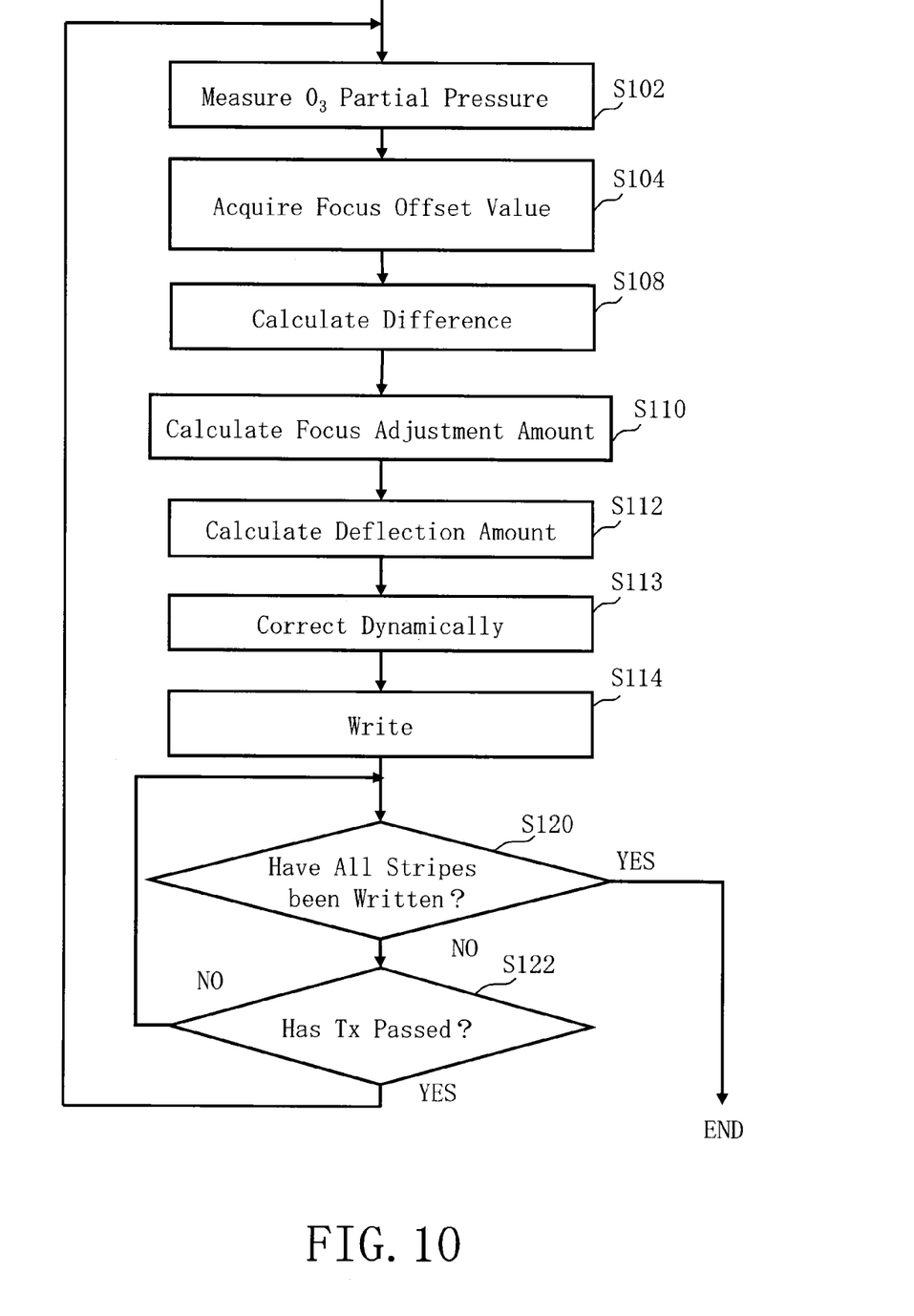
FIG. 10 is a flowchart showing main steps of a writing method according to the second embodiment.

FIG. 10 is a flowchart showing main steps of a writing method according to the second embodiment. FIG. 10 is the same as FIG. 8 except that a difference calculation step (S108), a focus adjustment amount calculation step (S110), a deflection amount calculation step (S112), and a dynamic focus correction step (S113) are added, instead of the adjustment (updating) step (S106), between the focus offset acquisition step (S104) and the writing step (S114). The contents of the present embodiment are the same as those of the first embodiment except what is described below.

The contents of the $O_3$ gas partial pressure measurement step (S102) and the focus offset acquisition step (S104) are the same as those of the first embodiment.

In the difference calculation step (S108), the difference calculation unit 68 reads a focus offset value currently set in the lens control circuit 130 through the writing control unit 52, and calculates a difference between the read focus offset value and a newly acquired focus offset value. It is preferable in the second embodiment to define the focus offset value as the dimension in the height direction (z direction). The difference value is output to the deflection control circuit 120.

In the focus adjustment amount calculation step (S110), the focus adjustment amount calculation unit 126 calculates an amount of focus adjustment for moving (adjusting) a focus position by the difference value (z value) above described. According to the second embodiment, for example, the main deflector 208 is used for dynamic focus correction. Therefore, the amount of focus adjustment is calculated as a digital signal for obtaining a voltage to be applied to the main deflector 208. The dynamic focus correction may also be performed by other electrostatic lens or the like which is additionally arranged, instead of being performed by the main deflector 208.

In the deflection amount calculation step (S112), the deflection amount calculation unit 124 for main deflection generates main deflection data based on the position defined in shot data. A deflection amount calculation unit for sub deflection (not shown) generates sub deflection data based on the position defined in the shot data. A deflection amount calculation unit for blanking (not shown) generates blanking data based on the shot data or irradiation time data (dose data) separately prepared. A deflection amount calculation unit for shaping (not shown) generates shaping data based on the figure type and size defined in the shot data.

According to the second embodiment, the deflection amount calculation step (S110) is described separately from the writing step (S114) in order to explain the dynamic focus correction step (S112), while the same processing as that of the deflection amount calculation step (S110) is performed in the writing step (S114) in the first embodiment.

In the dynamic focus correction step (S112), the correction unit 122 adds the amount of focus adjustment described above to the main deflection data. The main deflector 208 is configured by, for example, eight electrodes in order to be corresponding to all the directions. The main deflection data is individually generated for respective electrodes, and, in the dynamic focusing, the same amount of focus adjustment is added to each electrode. By correcting the main deflection data by the correction unit 122, the focus position for focusing the electron beam onto the target object 101 is adjusted according to a partial pressure of $O_3$ gas. The correction unit 122 is an example of an adjustment unit.

The corrected main deflection data is output to the DAC amplifier 132. The sub deflection data is output to the DAC amplifier for sub deflection (not shown). The blanking data is output to the DAC amplifier for blanking control (not shown). The shaping data is output to the DAC amplifier for beam shaping (not shown).

In the writing step (S114), the writing unit 150 writes a pattern on the target object by using a charged particle beam, in the state in which the focus position has been adjusted based on the partial pressure of the predetermined gas. According to the second embodiment, the electron beam 200 of the second aperture image having passed through the second shaping aperture plate 206 is deflected by the main deflector 208 and the sub deflector 209, in the state in which focusing has been performed by the objective lens 207 and the focus position has been dynamically corrected by performing focus offset adjusted depending on a partial pressure of $O_3$ gas (predetermined gas), so as to irradiate a desired position on the target object 101 placed on the XY stage 105 continuously moving. Other contents of the writing step (S114) are the same as those of the first embodiment.

Moreover, the contents of each step after the determination step (S120) and the repeated flow contents are the same as those of the first embodiment.

As described above, according to the second embodiment, beam focus deviation due to inflow of gas can be corrected without changing the setting for the objective lens 207. Therefore, positional deviation, etc. of a pattern caused by defocusing can be inhibited or reduced. Further, similarly to the first embodiment, contaminants adhering to a deflector etc. can be removed, and beam drift can be inhibited or reduced by the removal of contaminants.

Referring to specific examples, embodiments have been described above. However, the present invention is not limited to these examples.

While the apparatus configuration, control method, and the like not directly necessary for explaining the present invention are not described, some or all of them may be suitably selected and used when needed. For example, although description of the configuration of a control unit for controlling the writing apparatus 100 is omitted, it should be understood that some or all of the configuration of the control unit is to be selected and used appropriately when necessary.

In addition, any other charged particle beam writing apparatus and method that include elements of the present invention and that can be appropriately modified by those skilled in the art are included within the scope of the present invention.

Additional advantages and modification will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A charged particle beam writing apparatus comprising:
an emission unit configured to emit a charged particle beam;
a stage configured to mount thereon a target object to be written;
an objective lens configured to focus the charged particle beam on a surface of the target object;
a chamber configured to house the stage;
a measurement unit configured to measure a partial pressure of a predetermined gas in the chamber in a state where a pressure inside the chamber is controlled to be lower than an atmospheric pressure; and
an adjustment unit configured to adjust a focus position for focusing the charged particle beam on the target object, based on the partial pressure of the predetermined gas.

2. The apparatus according to claim 1, wherein the predetermined gas includes ozone ($O_3$).

3. The apparatus according to claim 1, wherein a pattern is written on the target object while the predetermined gas is being flowed in the chamber.

4. The apparatus according to claim 1, wherein the adjustment unit adjusts the focus position by using an offset value.

5. The apparatus according to claim 1, further comprising:
a storage device configured to store a correlation table; and
an offset acquisition unit configured to read the correlation table from the storage device, and acquire an offset value for focusing which corresponds to the partial pressure measured of $O_3$ gas.

6. The apparatus according to claim 5, wherein the adjustment unit adjusts the focus position by adding the offset value.

7. The apparatus according to claim 1, wherein the adjustment unit adjusts a voltage value for exciting the objective lens.

8. A charged particle beam writing apparatus comprising:
an emission unit configured to emit a charged particle beam;
a stage configured to mount thereon a target object to be written;
an objective lens configured to focus the charged particle beam on a surface of the target object;
a deflector configured to deflect the charged particle beam to a desired position on the target object;
a chamber configured to house the stage;
a measurement unit configured to measure a partial pressure of a predetermined gas in the chamber in a state where a pressure inside the chamber is controlled to be lower than an atmospheric pressure; and
a deflection control unit configured to control a deflection amount of the deflector, and adjust a focus position for focusing the charged particle beam on the target object, based on the partial pressure of the predetermined gas by using the deflector.

9. The apparatus according to claim 8, further comprising:
a storage device configured to store a correlation table; and
an offset acquisition unit configured to read the correlation table from the storage device, and acquire an offset value for focusing which corresponds to the partial pressure measured of $O_3$ gas.

10. The apparatus according to claim 9,
wherein a first offset value is set in the deflection control unit,
further comprising:
a difference calculation unit configured to read the first offset value currently set in the deflection control unit, and calculate a difference between the first offset value currently set and the offset value acquired newly as a second offset value,
wherein the deflection control unit calculates a focus adjustment amount for moving the focus position, based on the difference.

11. A charged particle beam writing method comprising:
measuring a partial pressure of a predetermined gas in a chamber housing a stage on which a target object to be written is placed, in a state in which a pressure inside the chamber is controlled to be lower than an atmospheric pressure;
adjusting a focus position for focusing a charged particle beam on the target object, based on the partial pressure of the predetermined gas; and
writing a pattern on the target object by using the charged particle beam, in a state in which the focus position has been adjusted based on the partial pressure of the predetermined gas.

* * * * *